US009606773B2

(12) United States Patent
Balkan et al.

(10) Patent No.: US 9,606,773 B2
(45) Date of Patent: Mar. 28, 2017

(54) SIMULATION-GUIDED INCREMENTAL STABILITY ANALYSIS

(71) Applicant: TOYOTA MOTOR ENGINEERING & MANUFACTURING NORTH AMERICA, INC., Erlanger, KY (US)

(72) Inventors: Ayca Balkan, Los Angeles, CA (US); Jyotirmoy Vinay Deshmukh, Torrance, CA (US); James Kapinski, Redondo Beach, CA (US)

(73) Assignee: TOYOTA MOTOR ENGINEERING & MANUFACTURING NORTH AMERICA, INC., Erlanger, KY (US)

( * ) Notice: Subject to any disclaimer, the term of this patent is extended or adjusted under 35 U.S.C. 154(b) by 249 days.

(21) Appl. No.: 14/462,218

(22) Filed: Aug. 18, 2014

(65) Prior Publication Data

US 2016/0048375 A1 Feb. 18, 2016
US 2016/0231990 A9 Aug. 11, 2016

Related U.S. Application Data

(60) Provisional application No. 62/010,132, filed on Jun. 10, 2014.

(51) Int. Cl.
*G06F 9/44* (2006.01)
*G06F 17/10* (2006.01)
*G06F 17/30* (2006.01)

(52) U.S. Cl.
CPC ........... *G06F 8/20* (2013.01); *G06F 17/10* (2013.01); *G06F 17/30424* (2013.01)

(58) Field of Classification Search
CPC ............. G06F 17/30; G06F 17/10; G06F 8/20
USPC ........................................................ 717/168
See application file for complete search history.

(56) References Cited

U.S. PATENT DOCUMENTS

| 7,433,743 | B2 | 10/2008 | Pistikopoulos et al. |
| 7,865,339 | B2 * | 1/2011 | Rushby ............... G06F 11/3684 703/2 |
| 8,862,439 | B1 * | 10/2014 | Kuehlmann .......... G06F 17/504 703/2 |
| 9,195,222 | B2 | 11/2015 | Kapinski et al. |

(Continued)

OTHER PUBLICATIONS

Aylward et al., "Stability and Robustness Analysis of Nonlinear Systems via Contraction Metrics and SOS programming", Dec. 30, 2007, p. 1-8.*

(Continued)

*Primary Examiner* — Duy Khuong Nguyen
(74) *Attorney, Agent, or Firm* — McDermott Will & Emery LLP

(57) ABSTRACT

A computer system may seek to identify at least one contraction metric that satisfies contraction conditions for a design of a dynamical system. The computer system may do so by formulating a search for a candidate contraction metric that is suspected of satisfying the contraction conditions for the design of the dynamical system from a set of simulation traces that describe the behavior of the dynamical system for a specific set of operating conditions. The search for the candidate contraction metric may then be performed.

The computer system may seek to verify that a candidate contraction metric for a design of a dynamical system satisfies contraction conditions by performing a process that uses solvers based on decision procedures.

15 Claims, 2 Drawing Sheets

(56) References Cited

U.S. PATENT DOCUMENTS

| | | | |
|---|---|---|---|
| 2005/0114809 A1* | 5/2005 | Lu | G06F 17/504 716/103 |
| 2005/0193739 A1 | 9/2005 | Brunell et al. | |
| 2006/0278753 A1 | 12/2006 | Ariyur et al. | |
| 2008/0228679 A1* | 9/2008 | Ward | G06F 17/504 706/21 |
| 2011/0010139 A1* | 1/2011 | Fuhrmann | G06F 17/504 703/2 |
| 2011/0184705 A1* | 7/2011 | Ganai | G06F 11/3608 703/2 |
| 2012/0259902 A1 | 10/2012 | Videen et al. | |
| 2013/0080129 A1* | 3/2013 | Smith | G06N 99/005 703/6 |

OTHER PUBLICATIONS

Arechiga et al., "Simulation-guided Lyapunov Analysis for Hybrid Dynamical Systems", Apr. 15-17, 2014, pp. 133-142.*

Lohmiller, W. et al. 2000 Nonlinear Process Control Using Contraction Theory. AIChE Journal, vol. 46, No. 3: pp. 588-596.

Lohmiller, W. et al 2000. Control System Design for Mechanical Systems Using Contraction Theory. IEEE Transactions on Automatic Control, vol. 45, No. 5: pp. 984-989.

Pham, Q.-C. et al. 2007. Stable Concurrent Synchronization in Dynamic System Networks. Neural Networks, vol. 20, No. 1: pp. 62-77.

Russo, G. et al. 2009. Contraction Theory and Master Stability Function: Linking Two Approaches to Study Synchronization of Complex Networks. IEEE Transactions on Circuits and Systems, vol. 56, No. 2: pp. 177-181.

Sharma, B.B. et al. 2009. Contraction Based Adaptive Control of a Class of Nonlinear Systems. American Control Conference, ACC '09, Hyatt Regency Riverfront, St. Louis, MO, USA, Jun. 10-12, 2009, pp. 808-813.

Slotine, J.-J. E. 2002. Modular Stability Tools for Distributed Computation and Control. Presented at NSL-021001, Oct. 2002. To be published in Int. J. Adaptive Control and Signal Processing, vol. 17, No. 6. 21 pages.

* cited by examiner

SIMULATION-GUIDED INCREMENTAL STABILITY ANALYSIS

CROSS-REFERENCE TO RELATED APPLICATION

This application is based upon and claims priority to U.S. provisional patent application 62/010,132, entitled "SIMULATION-GUIDED INCREMENTAL STABILITY ANALYSIS," filed Jun. 10, 2014. The entire content of this application is incorporated herein by reference.

BACKGROUND

Technical Field

This disclosure relates to designing embedded control software, including identifying at least one contraction metric that satisfies contraction conditions for a design of a dynamical system.

Description of Related Art

Embedded control software may be developed using a model-based development (MBD) paradigm. MBD may provide a framework under which system design specifications and performance models may be created.

One model in the MBD paradigm is the closed-loop model. This model may represent the composition of a plant model and a model of control software.

The plant model may be an encapsulation of dynamical aspects of the physical system for which the control software is being designed. In an automotive context, for example, a plant model may describe the dynamical behavior of an automotive engine, intake and exhaust manifolds, sensors, actuators, and/or other physical components. A plant model may be described as a dynamical system, which may be a mathematical model of a system described by a fixed number of states, and with ordinary differential equations (ODEs) describing the evolution of these states over time. In an automotive context, the states may represent physical quantities, such as pressures, masses of air, amount of fuel, and temperature.

The model of the control software or the controller model may be a logical abstraction of real-time software controlling the plant. The description of the controller model may be similar to that of a computer program, and may thus be associated with inputs, outputs, memory, and arithmetic and logical computations. The controller model may be described in a visual, block-diagram based, model-based design language.

A closed-loop model can be used to study and analyze properties of a control system. One problem for MBD may be to determine whether certain quantities of interest always remain within a desired operating regime. In the computer science literature, such a regime is sometimes called the safe region, and its set-complement the unsafe region. The problem of checking if any time-varying behavior of a given closed-loop model ever reaches an unsafe region is called the reachability problem. The reachability problem may be intractable, meaning that no computer algorithm may be able to solve it.

Another problem may be that of checking asymptotic behavior of a control system. This may mean analyzing the limiting behavior of system over arbitrarily long (infinite) time durations. All behaviors of the control system may need to converge to a desired reference behavior for the system to have desirable asymptotic behavior.

The two problems described above—the reachability problem and the problem of analyzing asymptotic behavior—may both be addressed by contraction analysis. This technique relies on showing the existence of a contraction metric for the closed-loop model.

Contraction analysis may be a relatively new development for control systems See W. Lohmiller and J. J. E. Slotine, "*On contraction analysis for non-linear systems*," Automatica, 34(6):683-696, 1998; F. Forni and R. Sepulchre, "*A differential lyapunov framework for contraction Analysis*," CoRR, abs/1208.2943, 2012. Techniques to obtain contraction metrics may exist only for specific classes of dynamical systems.

Mathematical definitions for contraction metrics were presented in W. Lohmiller and J. J. E. Slotine, "*On contraction analysis for non-linear systems*," Automatica, 34(6): 683-696, 1998 and extended in F. Forni and R. Sepulchre, "*A differential lyapunov framework for contraction Analysis*," CoRR, abs/1208.2943, 2012. In E. M. Aylward, P. A. Parrilo, and J.-J. E. Slotine, "*Stability and robustness analysis of nonlinear systems via contraction metrics and sos programming*," Automatica, 44(8):2163{2170, August 2008, SoS tools were used for systems with polynomial dynamics, i.e., polynomial expressions on the right-hand-sides of the system ODEs. They may require full knowledge of the system dynamics, and may reduce the analytic problem to finding the feasible solution of a semi-definite program. This technique may not work for systems with non-polynomial dynamics. The contraction metrics found by this technique may also be unsound and non-robust.

Contraction analysis is closely related to the notion of incremental stability. See D. Angeli, "*A Lyapunov approach to incremental stability properties*," IEEE Trans. on Automatic Control, 47(3):410-421. Work in control systems technology may build on the notion of incremental stability for safety verification of nonlinear switched systems. See P. S. Duggirala, S. Mitra, and M. Viswanathan, "*Verification of annotated models from executions*," In Proc. of the Conference on Embedded Software, pages 26:1-26:10, 2013; Z. Huang and S. Mitra, "*Proofs from simulations and modular annotations*," In Proc. of Hybrid Systems: Computation and Control, 2014. A key idea in this work may be that different kinds of annotations (including contraction metrics) can be used to aid safety verification. An assumption may be that these annotations are provided by the designer. Hence, this work may not provide any systematic approach to generating such annotations.

Semi-definite programming is an optimization technique to address several problems in control design. See S. Boyd, L. E. Ghaoui, E. Feron, and V. Balakrishnan, "*Linear Matrix Inequalities in System and Control Theory*," volume 15, SIAM, 1994; L. Vandenberghe and S. Boyd. Semidefinite Programming. SIAM Review, 38(1):49{95, 1996. Opensource software tools exist for solving these problems. See J. Löfberg. "*YALMIP: A toolbox for modeling and optimization in MATLAB*," In Proc. of the CACSD Conference, 2004; J. F. Sturm, Using SeDuMi 1.02, "*A MATLAB Toolbox for Optimization over Symmetric Cones*," Optimization Methods and Software, 11/12(1-4):625-653, 1999. The techniques may be computationally efficient, even for large industrial problems.

Decision procedures for nonlinear arithmetic queries are an area of research in the computer science literature. Open-source software tools based on interval constraint propagation techniques may exist for solving such queries. See S. Gao, J. Avigad, and E. M. Clarke, "δ-*complete decision procedures for satisfiability over the reals*," In J.

Automated Reasoning, pages 286-300, 2012. The tools may be computationally efficient for problems of a reasonable size.

In previous work, a technique was described to use simulations to compute Lyapunov functions for nonlinear dynamical systems. See J. Kapinski, J. V. Deshmukh, S. Sankaranarayanan, and N. Arechiga, "*Simulation-guided lyapunov analysis for hybrid dynamical systems*," In Proc. of Hybrid Systems: Computation and Control, pages 133-142, 2014 Lyapunov functions may also be used to address the reachability problem; however, the set of reachable states as estimated by using Lyapunov analysis can be significantly conservative and thusly an imprecise over-estimation. Lyapunov analysis may also be imprecise when analyzing asymptotic behavior of system trajectories with respect to each other.

Contraction analysis allows greater precision in analyzing asymptotic behavior, as well as for reachability analysis as compared to extant techniques. Existing methods for obtaining contraction metrics for nonlinear dynamical systems may be restricted to the class of polynomial dynamical systems. Current methods may not provide any mathematical soundness guarantees for the contraction metrics obtained, and may also suffer from numerical robustness in the solutions.

SUMMARY

A computer system may seek to identify at least one contraction metric that satisfies contraction conditions for a design of a dynamical system. The computer system may do so by formulating a search for a candidate contraction metric that is suspected of satisfying the contraction conditions for the design of the dynamical system from a set of simulation traces that describe the behavior of the dynamical system for a specific set of operating conditions. The search for the candidate contraction metric may then be performed.

The process may include searching for a counterexample that constitutes a simulation trace that describes the behavior of the dynamical system for a specific set of operating conditions and that violates contraction conditions for the candidate contraction metric.

The process may include searching again for a candidate contraction metric from a set of simulation traces that describe the behavior of the dynamical system for a specific set of operating conditions, while the search is constrained by information from the counterexample.

The search for a candidate contraction metric and the two searches for counterexamples may be repeated until a condition is met.

The condition may be that the search for the counterexample is unable to find a counterexample that constitutes a simulation trace that describes the behavior of the dynamical system for a specific set of operating conditions and that violates contraction conditions for the candidate contraction metric.

The condition may be that a specified amount of time has expired.

The condition may be that a specified number of searches have been made.

The second search for a counterexample may result in a candidate contraction metric. The condition may be that the last identified candidate contraction metric satisfies the contraction conditions, as determined by performing a process that includes using solvers based on decision procedures.

The process may include using solvers based on decision procedures to generate the counterexample.

The process may include using global optimizers to generate the counterexample.

The set of simulation traces may come from a first source. The process may include searching again for a candidate contraction metric from a set of simulation traces that come from a second source that is different from the first source and that describes the behavior of the dynamical system for a specific set of operating conditions.

The search may result in a candidate contraction metric. The process may include seeking to verify that the candidate contraction metric satisfies the contraction conditions by performing a process that uses solvers based on decision procedures.

The search for a candidate contraction metric may be performed by formulating a semidefinite programming problem and producing the search result using software.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

A general purpose technique is now described that may enable contraction analysis for closed-loop models of high complexity.

The measure of complexity may depend on the form in which the closed-loop model is presented. For example, the plant model may be described by ODEs, where a hallmark of high complexity could be the presence of nonlinear, nonpolynomial expressions, such as trigonometric, rational, exponential, logarithmic or other more complex expressions in the right-hand-side of the ODE. Alternatively, the closed-loop model may be provided in a non-analytic form, such as in a visual block-diagram-based MBD design language, where complexity may be correlated with the number of blocks present in the model.

The techniques that will now be described may build on simulation or test data to perform the analysis, in addition to existing tools, such as semidefinite programming tools, sum-of-squares (SoS) optimization tools, and tools implementing decision procedures for nonlinear arithmetic.

An algorithm is now described. It is assumed that a model of a system is provided and that simulation traces can be obtained from the model. Simulation traces are data that describe the system behavior for a specific set of operating conditions. The continuous state of the system is denoted as x. The input to the algorithm may be a subset of the domain of x, or a region in the continuous state-space over which a designer wishes to obtain a contraction metric. The contraction metric may be mathematically represented in terms of a square matrix that has the same dimension as x, and each entry of which may be a polynomial of a certain degree.

Figure 1:
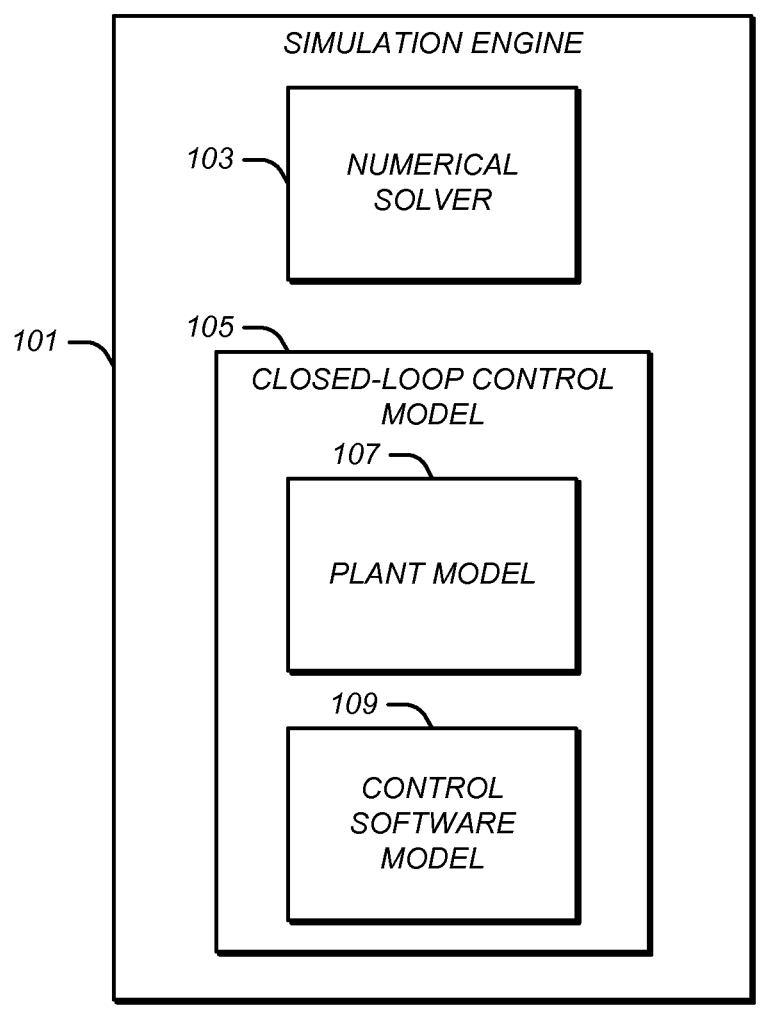
FIG. 1 illustrates an example of a simulation engine for a closed-loop control model.

FIG. 1 illustrates an example of a simulation engine 101 for a closed-loop control model 105. The simulation engine 101 may include a numerical solver 103, as well as the closed-loop control model 105. The numerical solver 103 may obtain numerical simulations of a dynamical system described by the closed-loop control model. The closed-loop control model 105 may describe a mathematical model of an automatic control system. This may include a plant model 107 and a control software model 109. The plant model 107 may be an encapsulation of dynamical aspects of the physical system for which the control software is being designed. The control software model 109 may be a logical abstraction of real-time software controlling the plant.

Figure 2:
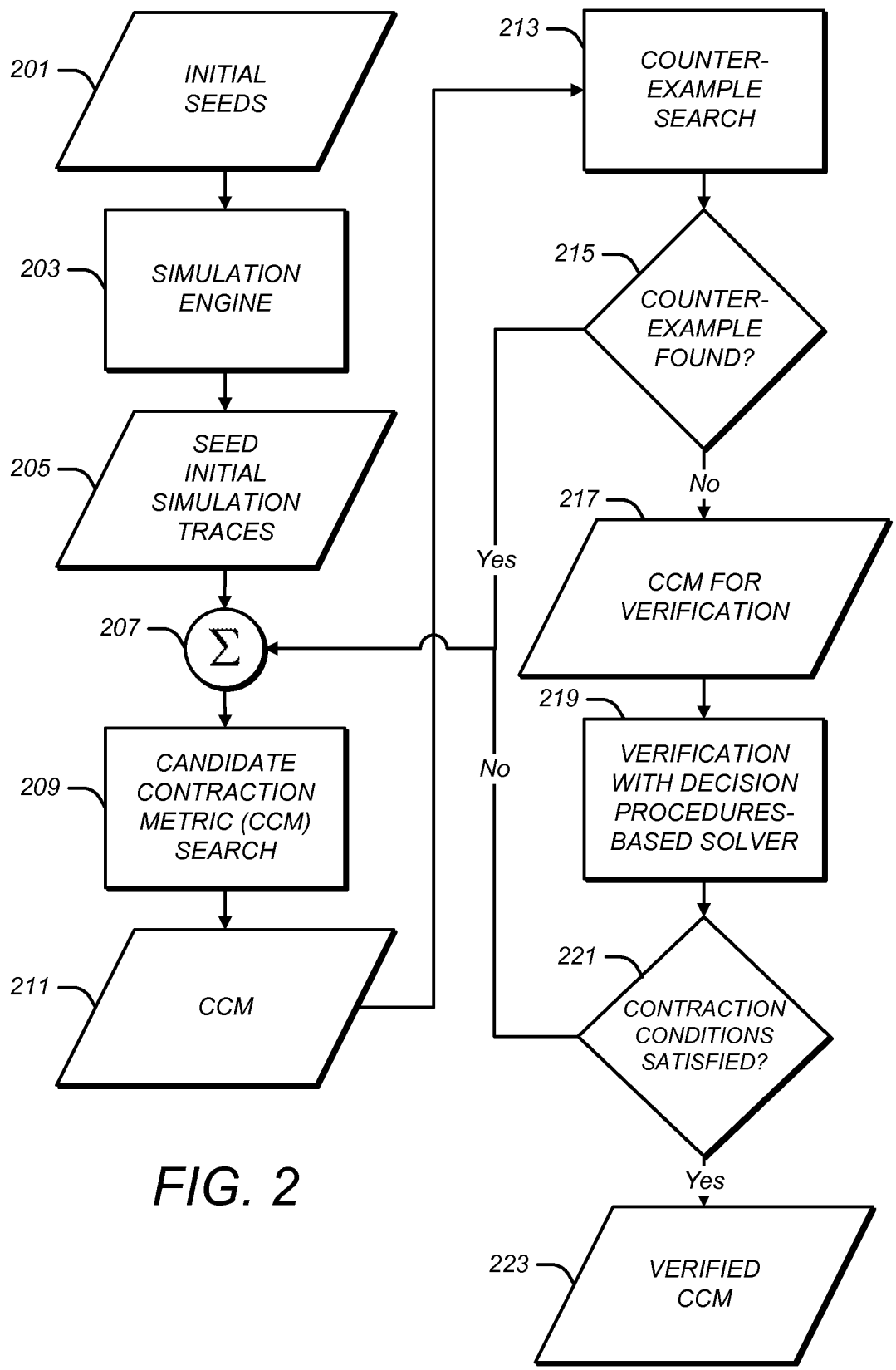
FIG. 2 illustrates steps of an algorithm that may be used to identify at least one contraction metric that satisfies contraction conditions for a design of a dynamical system.

FIG. 2 illustrates steps of an algorithm that may be used to identify at least one contraction metric that satisfies contraction conditions for a design of a dynamical system. Rectangular blocks represent methods or tools used, parallelograms represent data that is input to or output from a particular tool, diamond blocks represent decision nodes, and a circular represents data aggregation. Other embodiments of this process may use additional steps, not all of the illustrated steps, different steps, and/or steps in a different order.

An initial collection of simulation traces for a given model of a system may be provided. As illustrated in FIG. 2, initial seeds 201 may describe an assignment of initial values for the state-elements in the closed-loop model, and a description of exogenous inputs to the closed-loop model. A simulation engine 203 may use the initial seeds 201 to obtain initial simulation traces 205 of the closed-loop model using a numerical solver. The simulation engine 203 may be the same as the simulation engine 101 shown in FIG. 1 or different.

Initial simulation traces may be seeded, as reflected by a Seed Initial Simulation Trace step 205. These may be obtained, for example, by computing random numerical simulations of the closed-loop model 105, starting from a set of initial seeds that may represent initial conditions and input values for the closed-loop model 105.

Candidate Contraction Metric (CCM) Search

A search for a candidate contraction metric (CCM) from the set of seed initial simulation traces may be formulated, as reflected by a Candidate Contraction Metric (CCM) Search step 209. The search may be formulated as a semidefinite program, which may be solved using existing, efficient computer software programs, such as SeDuMi, and SDPT3; J. F. Sturm, Using SeDuMi 1.02, "A MATLAB Toolbox for Optimization over Symmetric Cones," and, K.-C. Toh, M. J. Todd, and R. H. Tütüncü, "SDPT3—a MATLAB software package for semidefinite programming," version 1.3, Optimization methods and software, 11(1-4):545-581, 1999. This may be accomplished as follows:

Fix a template form for the contraction metric. The template may specify the form (e.g., number of monomial terms and variables that exist in each term) of the polynomial that will result from the CCM search process.

Encode the information from the simulation traces as constraints that the contraction metric must satisfy. The constraints may take the form of linear matrix inequalities (LMIs), which are natural constraints for the semidefinite programming software. The constraints may be a set of necessary conditions for the resulting candidate solution to be a contraction metric. The constraints may require the Jacobian matrix of the system dynamics. The Jacobian matrix is a mathematical term denoting a matrix containing partial derivatives of the system dynamics along each system state. The technique may be applied regardless of whether the analytic form of the system dynamics is known. If known, the Jacobian can be determined analytically. If unknown, a numerical approximation of the Jacobian may be computed.

The search 209 may then be conducted. If a candidate contraction metric 211 is found during the CCM search, a counterexample search 213 may follow. If the semidefinite program is found to be infeasible, on the other hand, the process may be halted and a report may be provided about the need to refine the contraction metric template.

Counterexample Search

The counterexample search 213 may search for at least one simulation trace that invalidates the contraction conditions of the CCM that results from the CCM search 209.

A global optimizer may be used to search for a simulation trace that violates the conditions of the contraction metric within the provided region of interest during the counterexample search 213. If such a counterexample is found, as reflected in a Counterexample Found? decision step 215, it may be added to the set of simulation traces by a data aggregator 207, following which the search 209 may be repeated. If no counterexample is found, the CCM obtained from the last execution of the CCM search 209 may be provided as the CCM for verification 217 as input to step 219.

The CCM for verification 217 may describe a CCM that the global optimizer in the counterexample search 213 is unable to invalidate.

Verification with Decision Procedures-Based Solvers.

A Verification with Decision Procedures-Based Solver step 219 may next be performed. This step may use a computer algorithm to verify that the candidate contraction metric 211 correctly satisfies the conditions to be a contraction metric. This may be done, for example, using one of the following:

Tools implementing decision procedures for nonlinear real arithmetic, or

A sampling-based technique to verify the candidate contraction metric 211

The first approach may be by algorithmically deciding if the conditions for the contraction metric are met at every point within the region of interest. These conditions can be reduced to checking positive semi-definiteness or negative semi-definiteness of a matrix of polynomials, both of which can be converted into logical queries to be solved by an appropriate nonlinear real arithmetic solver. To decide these queries, a dReal tool may be used. See S. Gao, J. Avigad, and E. M. Clarke, "δ-*complete decision procedures for satisfiability over the reals*," In J. Automated Reasoning, pages 286-300, 2012.

The second approach may be based on testing the validity of the contraction metric at a sufficiently dense set of points within the region of interest, with the density dependent on mathematical properties of the system dynamics. A computer implementation that randomly samples points from the region of interest and tests contraction conditions at each point, till the desired density is achieved, can be used to perform the second approach.

Both approaches may require knowledge of system dynamics. If there is not full knowledge of the system dynamics, a variant of the sampling-based method may be employed to test for contraction metric validity. If the contraction metric can be successfully verified in a Contraction Condition Satisfied step 221, then the process may be halted and the successful metric may be reported, as reflected in a Verified CCM data output 223. If not, the violating points may be added in the search region to the set of initial states by the data aggregator 207 and the process repeated, as illustrated in FIG. 2.

A prototype of this technique was implemented in a MATLAB programming environment, using freely available SeDuMi, YalMIP, SDPT3 optimization packages, see MATLAB, version 7.12.0 (R2011a), The MathWorks Inc., Natick, Mass., 2011; J. F. Sturm, Using SeDuMi 1.02, "*A MATLAB Toolbox for Optimization over Symmetric Cones*," Optimization Methods and Software, 11/12(1-4):625-653, 1999; J. Löfberg, "*YALMIP: A toolbox for modeling and optimization in MATLAB*," In Proc. of the CACSD Conference, 2004; K.-C. Toh, M. J. Todd, and R. H. Tütüncü, "*SDPT3—a MATLAB software package for semidefinite programming*," version 1.3, Optimization methods and software, 11(1-4):545-581, 1999, and a dReal SMT solver, see S. Gao, J. Avigad, and E. M. Clarke, "δ-*complete decision procedures for satisfiability over the reals*," In J. Automated Reasoning, pages 286-300, 2012. The following example illustrates this technique.

The dynamics of a whirling pendulum, see A. Papachristodoulou and S. Prajna, "*On the construction of lyapunov functions using the sum of squares decomposition*, In Proc. of IEEE Conf. on Decision and Control, volume 3, pages 3482-3487, December 2002, may be defined by the following nonlinear differential equations:

$$\begin{bmatrix} \dot{x}_1 \\ \dot{x}_2 \end{bmatrix} = \begin{bmatrix} x_2 \\ -\frac{kf}{mb} x_2 + w^2 \sin(x_1)\cos(x_1) - \frac{g}{l_p}\sin(x_1) \end{bmatrix},$$

where $x_1$ is the angular position and $x_2$ is the angular velocity. The values of the parameters may be:

| Parameter | Value |
|---|---|
| $k_f$ | 0.2 |
| $m_b$ | 1 |
| w | 0.9 |
| $l_p$ | 10 |

The procedure inherent in the equation above was performed on a whirling pendulum in order to find a contraction metric for the region $X=\{x|x^T x \leq 1\}$. The resulting contraction metric shows that, considering any trajectory that starts in a ball of constant radius with respect to the constructed contraction metric, centered at a given trajectory and contained in X at all times, this trajectory may remain in that ball and may converge exponentially to the given trajectory.

Features of what has been described may include a simulation-based technique to identify provably correct contraction metrics for MBD designs. This technique may employ efficient semidefinite programming techniques, SoS optimization, global optimization, and decision procedures for nonlinear real arithmetic. All of these may be computationally tractable, even for complex system designs.

The technique to obtain Lyapunov functions may not require simulation-based local estimation of the system dynamics or the Jacobian matrix of the system dynamics. See S. H. Srogatz, "Nonlinear Dynamics and Chaos," Perseus publishing, 2001. This step may considerably increase the search difficulty.

The technique for discovering Lyapunov functions may not contain a final verification step in the process using nonlinear arithmetic solvers. This may help obtain provably correct results.

The output of a previous technique is a Lyapunov function that shows system stability to an equilibrium point. The output of what has been proposed herein may be a contraction metric. A contraction metric may be a stronger property of the system, and may be used to prove incremental stability of a system. Thus, the goals of the two techniques may be substantially different.

A sampling-based verification step may not have been used before.

The various algorithms that have been discussed herein are implemented with a computer system configured to perform them. The computer system includes one or more processors, tangible memories (e.g., random access memories (RAMs), read-only memories (ROMs), and/or programmable read only memories (PROMS)), tangible storage devices (e.g., hard disk drives, CD/DVD drives, and/or flash memories), system buses, video processing components, network communication components, input/output ports, and/or user interface devices (e.g., keyboards, pointing devices, displays, microphones, sound reproduction systems, and/or touch screens).

The computer system may include one or more computers at the same or different locations. When at different locations, the computers may be configured to communicate with one another through a wired and/or wireless network communication system.

The computer system may include software (e.g., one or more operating systems, device drivers, application programs, and/or communication programs). When software is included, the software includes programming instructions and may include associated data and libraries. When included, the programming instructions are configured to cause the computer system to implement one or more of the algorithms that have been described implement one or more of the functions of the computer system.

The software may be stored on or in one or more non-transitory, tangible storage devices, such as one or more hard disk drives, CDs, DVDs, and/or flash memories. The software may be in source code and/or object code format. Associated data may be stored in any type of volatile and/or non-volatile memory. The software may be loaded into a non-transitory memory and executed by one or more processors.

The components, steps, features, objects, benefits, and advantages that have been discussed are merely illustrative. None of them, or the discussions relating to them, are intended to limit the scope of protection in any way. Numerous other embodiments are also contemplated. These include embodiments that have fewer, additional, and/or different components, steps, features, objects, benefits, and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A non-transitory, tangible, computer-readable storage medium containing a program of instructions that cause a computer system running the program of instructions to perform a process that includes:
   obtaining a set of simulation traces or test data that describe the behavior of a dynamical system for a specific set of operating conditions;
   identifying at least one contraction metric that satisfies contraction conditions, including:
   formulating a search for a candidate contraction metric that is suspected of satisfying the contraction conditions for the design of a dynamical system from the set of simulation traces or test data that describe the behavior of the dynamical system for a specific set of operating conditions;
   performing the search for the candidate contraction metric, wherein the search results in a candidate contraction metric;
   verifying that the candidate contraction metric satisfies the contraction conditions by performing a process that uses solvers based on decision procedures; and
   designing the dynamical system taking into consideration the candidate contraction metric.

2. The storage medium of claim 1 wherein the process includes searching for a counterexample that constitutes a simulation trace that describes the behavior of the dynamical system for a specific set of operating conditions and that violates contraction conditions for the candidate contraction metric.

3. The storage medium of claim 2 wherein the process includes searching again for a candidate contraction metric from a set of simulation traces that describe the behavior of the dynamical system for a specific set of operating conditions while the search is constrained by information from the counterexample.

4. The storage medium of claim 3 wherein the process includes repeating the search for a candidate contraction metric and the two searches for counterexamples until a condition is met.

5. The storage medium of claim 4 wherein the condition is that the second search for a counterexample is unable to find a counterexample that constitutes a simulation trace that describes the behavior of the dynamical system for a specific set of operating conditions and that violates contraction conditions for the candidate contraction metric.

6. The storage medium of claim 4 wherein the condition is that a specified amount of time has expired.

7. The storage medium of claim 4 wherein the condition is that a specified number of searches have been made.

8. The storage medium of claim 4:
   wherein the second search for a counterexample results in a candidate contraction metric; and
   the condition is that the last identified candidate contraction metric satisfies the contraction conditions as determined by performing a process that includes using solvers based on decision procedures.

9. The storage medium of claim 2 wherein the process includes using solvers based on decision procedures to generate the counterexample.

10. The storage medium of claim 9 wherein the process includes using global optimizers to generate the counterexample.

11. The storage medium of claim 2 wherein the process includes using global optimizers to generate the counterexample.

12. The storage medium of claim 1 wherein:
the set of simulation traces comes from a first source; and
the process includes searching again for a candidate contraction metric from a set of simulation traces that come from a second source that is different from the first source and that describe the behavior of the dynamical system for a specific set of operating conditions.

13. The storage medium of claim 1 wherein the search is performed by formulating a semidefinite programming problem and producing the search result using software.

14. A method of building a dynamical system comprising:
obtaining a set of simulation traces that describe the behavior of the dynamical system for a specific set of operating conditions;
using a computer system running a program of instructions that seeks to identify at least one contraction metric that satisfies contraction conditions to:
formulate a search for a candidate contraction metric that is suspected of satisfying the contraction conditions for the design of the dynamical system from the set of simulation traces that describe the behavior of the dynamical system for a specific set of operating conditions; and
perform the search for the candidate contraction metric, wherein the search results in a candidate contraction metric; and
verify that the candidate contraction metric satisfies the contraction conditions by performing a process that uses solvers based on decision procedures;
designing the dynamical system taking into consideration the candidate contraction metric; and
building the designed dynamical system.

15. A method of building an improved dynamical system comprising:
obtaining test data from a dynamical system that describe the behavior of the dynamical system for a specific set of operating conditions;
using a computer system running a program of instructions that seeks to identify at least one contraction metric that satisfies contraction conditions to:
formulate a search for a candidate contraction metric that is suspected of satisfying the contraction conditions for the design of the dynamical system from the test data that describe the behavior of the dynamical system for a specific set of operating conditions;
perform the search for the candidate contraction metric, wherein the search results in a candidate contraction metric; and
verify that the candidate contraction metric satisfies the contraction conditions by performing a process that uses solvers based on decision procedures;
designing the dynamical system taking into consideration the candidate contraction metric; and
building the designed dynamical system.

\* \* \* \* \*